(12) United States Patent
Li

(10) Patent No.: US 11,011,726 B2
(45) Date of Patent: May 18, 2021

(54) BENDABLE BACKPLATE STRUCTURE AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Yun Li, Wuhan (CN)

( * ) Notice: Subject to any disclaimer, the term of this patent is extended or adjusted under 35 U.S.C. 154(b) by 179 days.

(21) Appl. No.: 16/349,284

(22) PCT Filed: Nov. 2, 2018

(86) PCT No.: PCT/CN2018/113790
§ 371 (c)(1),
(2) Date: May 13, 2019

(87) PCT Pub. No.: WO2019/233030
PCT Pub. Date: Dec. 12, 2019

(65) Prior Publication Data
US 2020/0266383 A1 Aug. 20, 2020

(30) Foreign Application Priority Data
Jun. 5, 2018 (CN) .......................... 201810567959.1

(51) Int. Cl.
*H01L 51/52* (2006.01)
*H01L 51/00* (2006.01)
*H01L 27/32* (2006.01)

(52) U.S. Cl.
CPC ...... *H01L 51/5237* (2013.01); *H01L 27/3244* (2013.01); *H01L 51/0097* (2013.01); *H01L 2251/5338* (2013.01)

(58) Field of Classification Search
CPC ............ H01L 51/5237; H01L 51/0097; H01L 27/3244; H01L 2251/5338
See application file for complete search history.

(56) References Cited

U.S. PATENT DOCUMENTS

| | | | | |
|---|---|---|---|---|
| 4,483,326 | A * | 11/1984 | Yamaka | A61B 1/0057 600/141 |
| 9,078,338 | B2 * | 7/2015 | Ohtaka | H04M 1/0202 |
| 9,710,022 | B2 * | 7/2017 | Lee | G06F 1/1652 |
| 10,331,173 | B2 * | 6/2019 | Cho | G06F 1/1652 |
| 10,334,090 | B2 * | 6/2019 | Kikuchi | H04M 1/0216 |
| 10,338,716 | B2 * | 7/2019 | Endo | G02F 1/13338 |
| 10,401,907 | B2 * | 9/2019 | Song | G06F 1/1652 |
| 10,551,880 | B1 * | 2/2020 | Ai | G06F 1/1641 |
| 10,623,537 | B2 * | 4/2020 | Lee | H04M 1/0216 |
| 10,840,464 | B2 * | 11/2020 | Hiroki | H01L 51/0097 |
| 2008/0174127 | A1 * | 7/2008 | Kim | H04M 1/0214 292/251.5 |

(Continued)

*Primary Examiner* — Ida M Soward

(57) ABSTRACT

A bendable backplate structure is configured to support a display panel and includes a supporting plate including at least a shaft channel extending to opposite sides of the supporting plate. A surface of the supporting plate is attached with the display panel. A bendable module disposed in the shaft channel includes a flexible covering portion and at least a magnet accommodated in and along the covering portion. The backplate structure and the display panel are foldable through the bendable module in a direction toward the display panel.

14 Claims, 6 Drawing Sheets

(56) References Cited

U.S. PATENT DOCUMENTS

| | | | |
|---|---|---|---|
| 2014/0028865 A1* | 1/2014 | Ohtaka | G06F 1/1686 348/211.4 |
| 2014/0028903 A1* | 1/2014 | Ohtaka | G06F 1/1626 348/373 |
| 2014/0169853 A1* | 6/2014 | Sharma | G06F 3/0202 400/481 |
| 2015/0255023 A1* | 9/2015 | Lee | G06F 1/1681 345/204 |
| 2018/0095502 A1* | 4/2018 | Yamazaki | G06F 1/1643 |
| 2018/0129249 A1* | 5/2018 | Ko | G06F 1/1681 |
| 2019/0025887 A1* | 1/2019 | Seo | G06F 1/1681 |

* cited by examiner

BENDABLE BACKPLATE STRUCTURE AND DISPLAY DEVICE

BACKGROUND OF INVENTION

1. Field of Invention

The present invention relates to a display field, and particularly to a bendable backplate structure and a display device.

2. Related Art

Organic light-emitting diode (OLED) devices have become novel display devices having most potential due to advantages of being self-luminous, all-solid, and having high contrast, etc. In particular, flexible and bendable properties make OLEDs more beneficial to develop diverse display devices.

One feature of conventional electronic apparatus with display devices, for example, such as mobile phones or tablets, is known for their convenience in carrying and use. However, due to bending incapabilities, conventional display devices are inevitable to be designed with a small sized screen for easily carrying. Unfortunately, the use of small size display devices has its disadvantages, such as the inability to visualize effects as well as large sized display devices, and because an image is small, user's eyes are easy to get tired. Therefore, it is imperative to improve display devices so that they can be bent and more convenient to carry, and can increase the display size.

SUMMARY OF INVENTION

An object of the present invention is to provide a bendable backplate structure and a display device capable of folding up or opening up to be conveniently carried and to reduce size for easy carry, and therefore to provide diverse use types.

To achieve the above-mentioned object, the bendable backplate structure of the present invention is configured to support the display panel. The backplate structure comprises a supporting plate comprising at least a shaft channel extending to opposite sides of the supporting plate, wherein a surface of the supporting plate is attached with the display panel; and a bendable module disposed in the shaft channel and comprising a flexible covering portion and at least a magnet accommodated in and along the covering portion; wherein the backplate structure and the display panel are foldable through the bendable module in a direction toward the display panel.

In one aspect of the present invention, the covering portion of the bendable module integrally extends to form a connecting portion and an auxiliary shaft portion, one end of the connecting portion is connected with the covering portion, and the other end of the connecting portion is connected with the auxiliary shaft portion, and a magnet is accommodated in the auxiliary shaft portion, wherein the magnet in the auxiliary shaft portion is movable to the bendable module by bending the connecting portion and is magnetically attached to both the magnet in the bendable module and the display panel.

In another aspect of the present invention, the auxiliary shaft portion comprises an accommodation portion for accommodating a stylus pen.

In another aspect of the present invention, the auxiliary shaft portion has a diameter smaller than a width of the covering portion of the bendable module.

In another aspect of the present invention, the magnet in the auxiliary shaft portion is cylindrical in shape, and one end of the auxiliary shaft portion far away from the connecting portion extends to one end of the bendable module far away from the connecting portion.

In another aspect of the present invention, the backplate structure further comprises a flexible casing covering a surface of the supporting plate opposite to the display panel.

In another aspect of the present invention, the supporting plate further comprises an opening portion located corresponding to components of the display panel and configured for accommodating the components.

In another aspect of the present invention, a flexible, adhesive element is provided between the covering portion of the bendable module and the shaft channel for bonding the bendable module and the shaft channel together.

The present invention further provides a display device comprising an organic light emitting diode (OLED) display panel; and a backplate structure, comprising: a supporting plate comprising at least a shaft channel extending to opposite sides of the supporting plate, wherein a surface of the supporting plate is attached with the OLED display panel; a bendable module disposed in the shaft channel and comprising a flexible covering portion and at least a magnet accommodated in and along the covering portion; and a flexible casing and covering a surface of the supporting plate opposite to the OLED display panel; wherein the backplate structure and the OLED display panel are foldable through the bendable module in a direction toward the OLED display panel.

In one aspect of the present invention, the covering portion of the bendable module integrally extends to form a connecting portion and an auxiliary shaft portion, one end of the connecting portion is connected with the covering portion, and the other end of the connecting portion is connected with the auxiliary shaft portion, and a magnet is accommodated in the auxiliary shaft portion, wherein the magnet in the auxiliary shaft portion is movable to the bendable module by bending the connecting portion and is magnetically attached to both the magnet in the bendable module and the display panel.

The present invention further provides a bendable backplate structure, configured to support a display panel, and the backplate structure comprises a supporting plate comprising at least a shaft channel extending to opposite sides of the supporting plate and disposed on a middle of the supporting plate, wherein a surface of the supporting plate is attached with the display panel; and a bendable module disposed in the shaft channel and comprising a flexible covering portion and at least a magnet accommodated in and straightly along the covering portion, and the backplate structure and the display panel being foldable through the bendable module in a direction toward the display panel; wherein the covering portion of the bendable module integrally extends to form a connecting portion and an auxiliary shaft portion, one end of the connecting portion is connected with the covering portion, and the other end of the connecting portion is connected with the auxiliary shaft portion, and the auxiliary shaft portion is accommodated with a magnet, wherein the magnet in the auxiliary shaft portion is movable to the bendable module by bending the connecting portion and is magnetically attached to both the magnet in the bendable module and the display panel.

In another aspect of the present invention, the auxiliary shaft portion has a diameter smaller than a diameter of the covering portion of the bendable module.

In another aspect of the present invention, the backplate structure further comprises a flexible casing covering a surface of the supporting plate opposite to the display panel.

In another aspect of the present invention, the supporting plate further comprises an opening portion located corresponding to components of the display panel and configured for accommodating the components.

The backplate structure of the present invention utilizes the configuration of the flexible leather material in combination with the magnets, and the magnetic attraction of the magnet of the auxiliary shaft portion and the magnet of the covering portion to apply a force on the flexible display panel, so that the backplate is easy to be bent over where the magnet and are magnetically attracted, thereby to effectively overcome drawbacks of traditional display devices that are not provided with bendable structure, incapable of bending, and inconvenient to carry.

DESCRIPTION OF PREFERRED EMBODIMENTS

Figure 1:
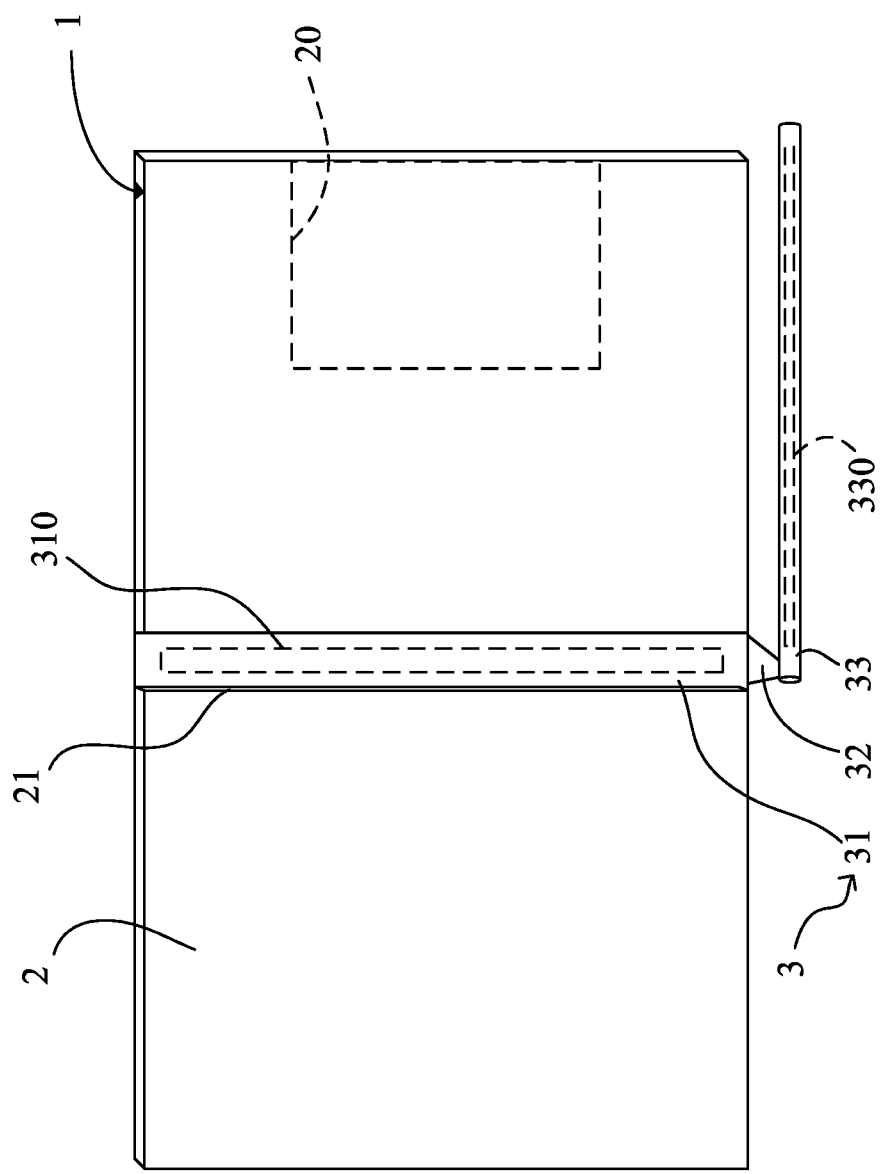
FIG. 1 is a schematic back side view of a backplate structure of an embodiment of the present invention.

The following embodiments are referring to the accompanying drawings for exemplifying specific implementable embodiments of the present disclosure. Furthermore, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, elements with similar structures are labeled with like reference numerals.

The present invention provides a bendable backplate structure and display panel. The display panel has featured in bending and is exemplified by, such as, organic light emitting diodes (OLEDs) having self-luminance and bendable properties, but not limited thereto. The bendable backplate is applicable to mobile phones, tablets, or screens of televisions.

Figure 2:
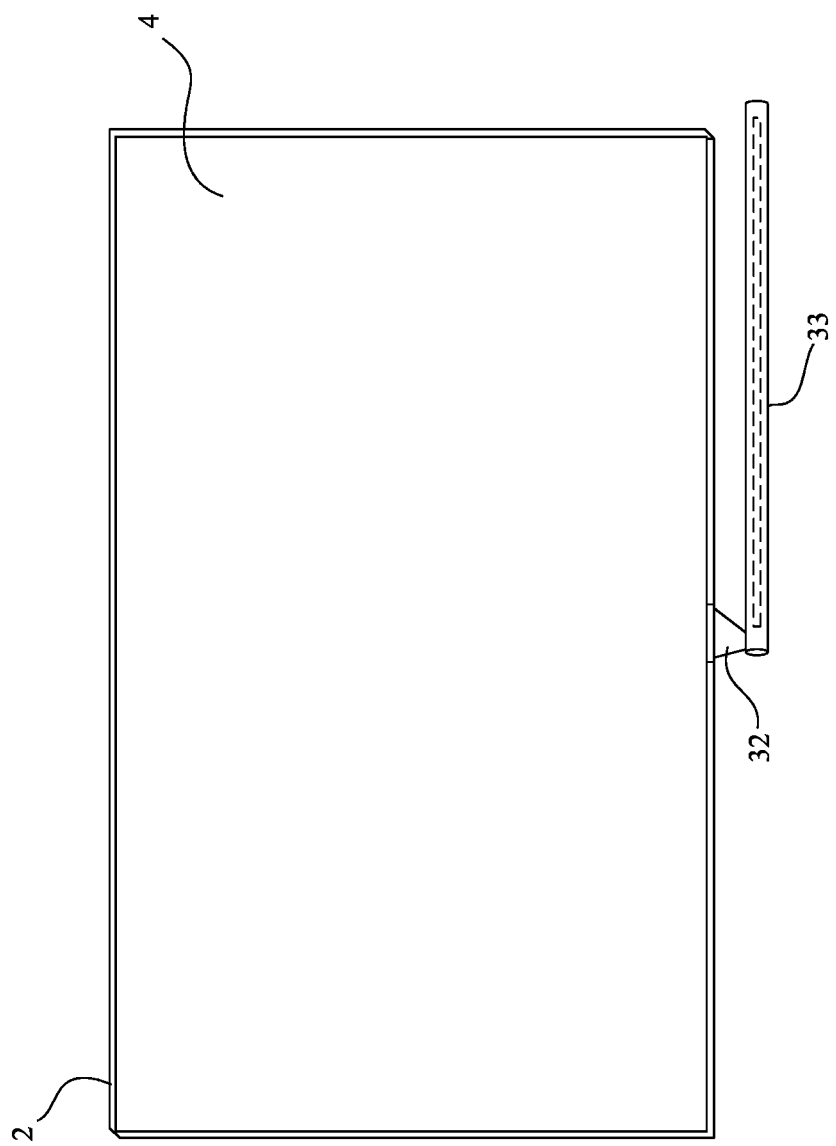
FIG. 2 is a schematic front side view of FIG. 1.
Figure 3:
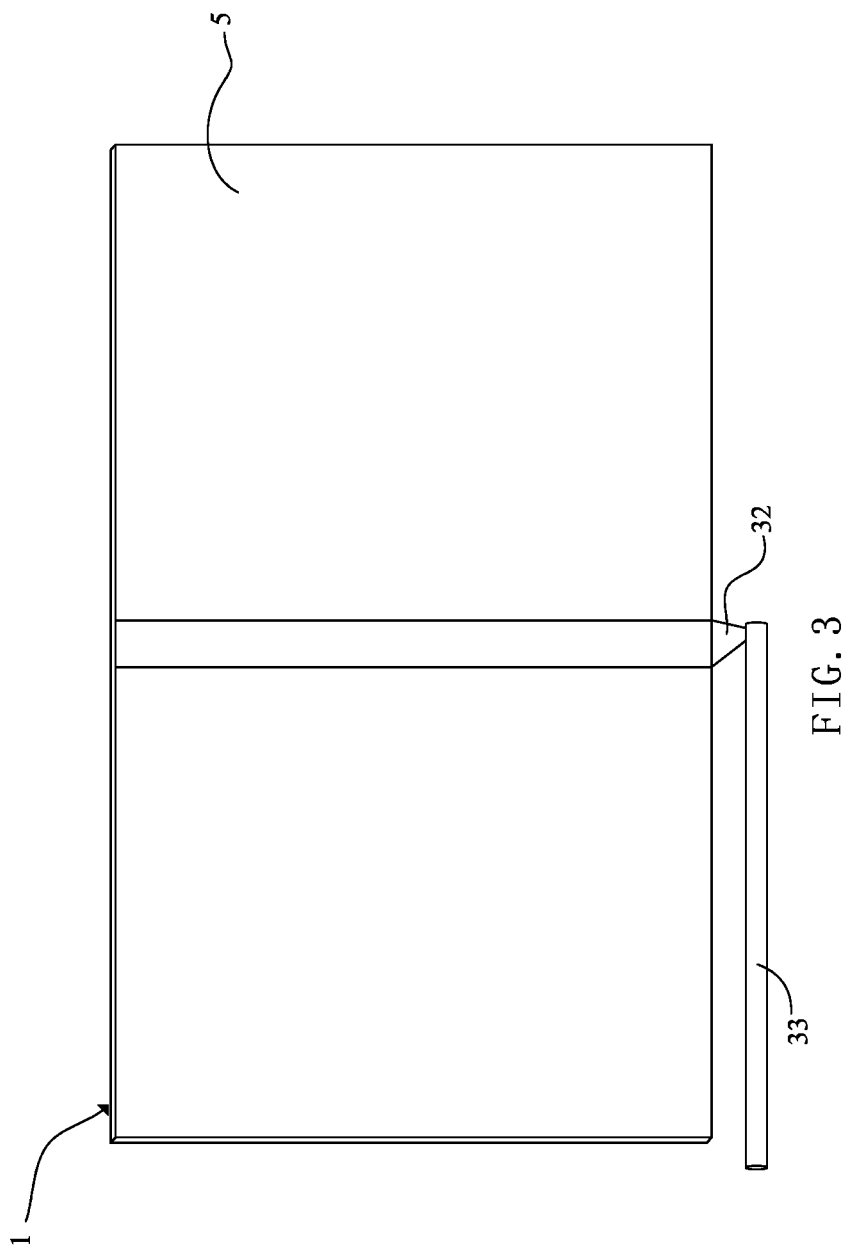
FIG. 3 is another schematic back side view of the backplate structure including a casing of the present invention.

Please refer to FIG. 1 and FIG. 2. FIG. 1 is a schematic back side view of a backplate structure of an embodiment of the present invention. FIG. 2 is a schematic front side view of FIG. 1. A bendable backplate structure 1 of the present invention is configured to support a display panel 4. The backplate structure includes a supporting plate 2, a bendable module 3, and a casing 5 (as shown in FIG. 3). The supporting plate 2 is made of a metal being high in hardness, light in weight, and easy to be formed, or polyethylene terephthalate (PET). The supporting plate 2 includes a shaft channel 21 extending to opposite sides of the supporting plate 2. In the preferable embodiment, the shaft channel 21 is disposed on a middle of the supporting plate 2. As shown in FIG. 2, a surface of the supporting plate 12 is attached with the display panel 4. Moreover, the supporting plate 2 further includes an opening portion 20 located corresponding to components of the display panel 4 and configured for accommodating the components, for example, such as OLED flexible flat cable or other components, thereby to avoid an increase in thickness of the supporting plate 2 due to the intention of accommodating OLED components.

The bendable module 3 is disposed in the shaft channel 21 and includes a flexible covering portion 31 and a first magnet 310 accommodated in and along the covering portion 31. In this embodiment, the first magnet 310 is cylindrical in shape and extends straightly along the shaft channel 21. Alternatively, in another embodiment, there are a plurality of the cylindrical first magnets 310 arranged in parallel (not shown). The covering portion 31 is made of a material having high flexibility and moderate hardness, such as a leather material.

The casing 5 is flexible and covers a surface of the supporting plate 2 opposite to the display panel 4. The casing 5 is made of a material having high flexibility and moderate hardness, such as a leather material. The casing 5 is laminated to the supporting plate 2 and the bendable module 3 through glue, wherein the glue is water glue or optical glue.

Figure 4:
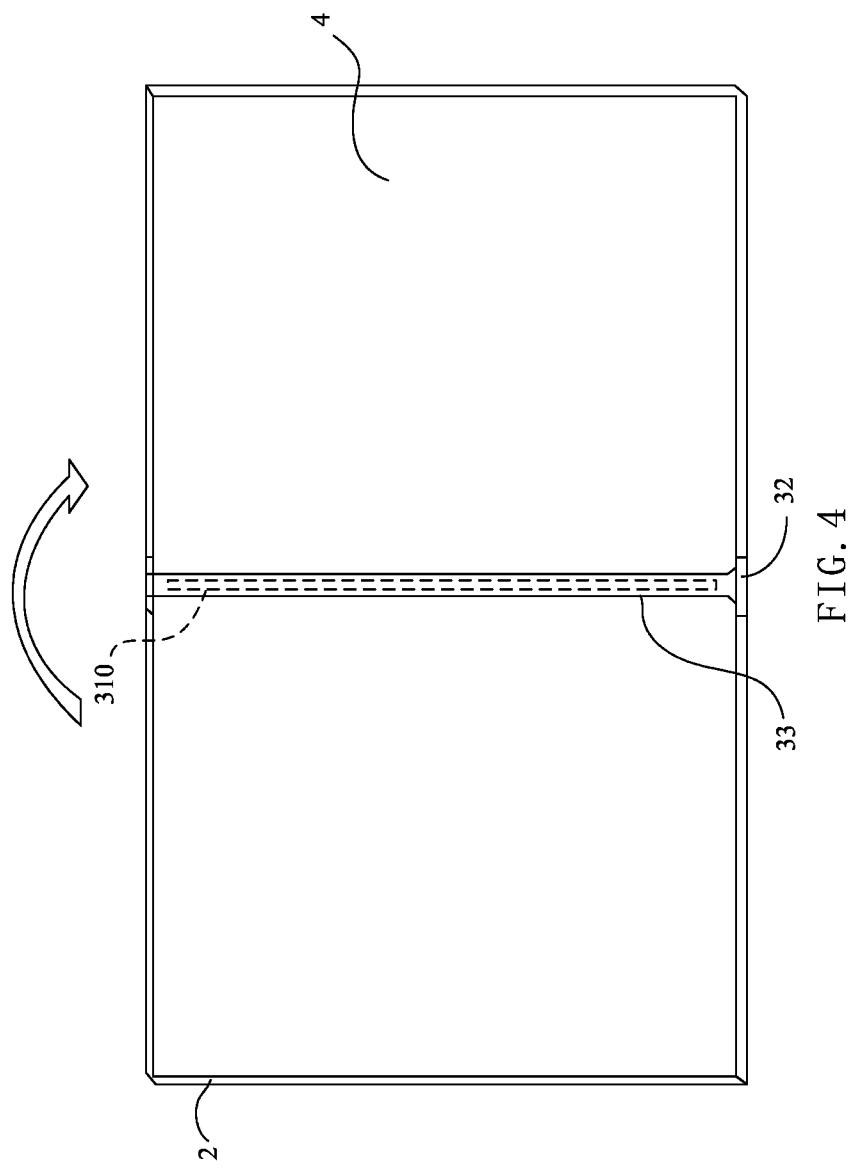
FIG. 4 is a schematic operational process view showing that an auxiliary shaft portion of the present invention is bent.
Figure 5:
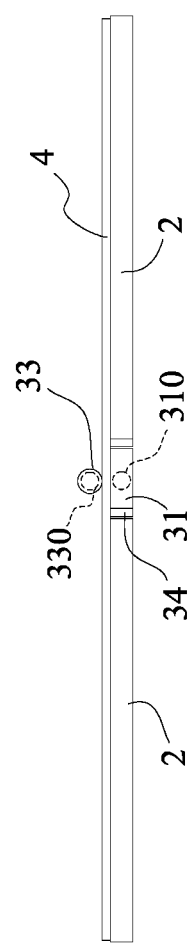
FIG. 5 is a schematic top plan view of FIG. 4.
Figure 7:
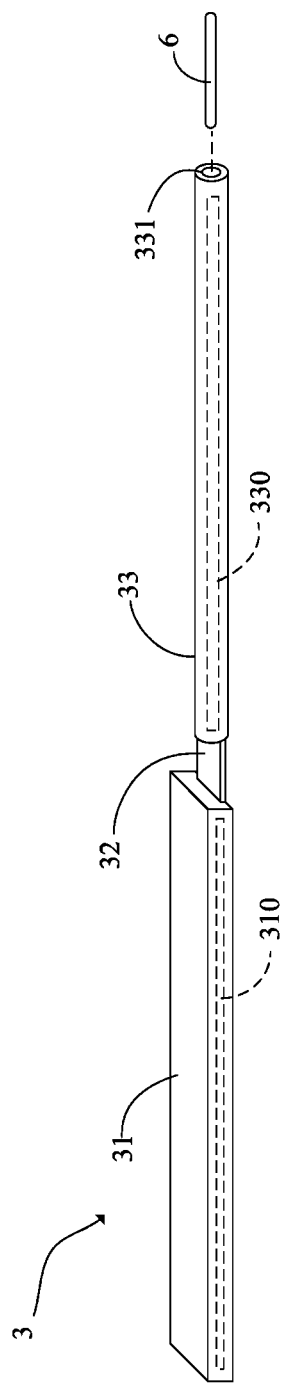
FIG. 7 is a schematic perspective view of a bendable module of a bendable module of the present invention.

Particularly, the covering portion 31 of the bendable module 3 integrally extends to form a connecting portion 32 and an auxiliary shaft portion 33. One end of the auxiliary shaft portion 33 far away from the connection portion 32 extends to one end of the bendable module 3 far away from the connection portion 32. One end of the connecting portion 32 is connected with the covering portion 31, and the other end of the connecting portion 32 is connected with the auxiliary shaft portion 33. In addition, a cylindrical second magnet 330 is accommodated in the auxiliary shaft portion 33. The covering portion 32 and the auxiliary shaft portion 33 are made of a leather material. FIG. 4 is a schematic operational process view showing that an auxiliary shaft portion of the present invention is bent. The second magnet 330 in the auxiliary shaft portion 33 is movable to the bendable module 3 by bending the connecting portion 32 and is magnetically attached onto the first magnet 310 in the bendable module 3. A flexible, adhesive element 34 is provided between the covering portion 31 of the bendable module 3 and the shaft channel 21 for bonding the bendable module 3 and the shaft channel 21 together (as shown in FIG. 5). Furthermore, the auxiliary shaft portion 33 includes an accommodation portion 331 for accommodating a stylus pen 6 (as shown in FIG. 7). In one embodiment, the auxiliary shaft portion 33 is configured to be insertable to an external slot (not shown) to hold the backplate structure 1.

Figure 6:
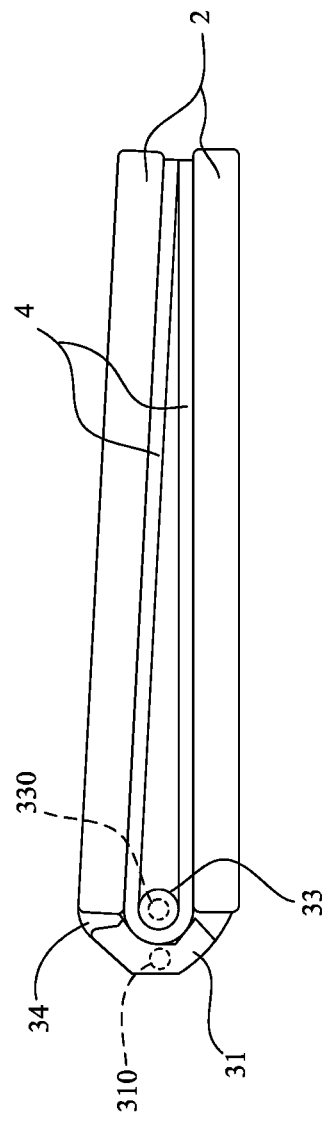
FIG. 6 is a schematic side view showing that a backplate structure and a display panel of the present invention are bent.

FIG. 6 is a schematic side view showing that a backplate structure and a display panel of the present invention are bent. Please refer to FIG. 6 in combination with FIGS. 2 and 4. The backplate structure 1 of the present invention is capable of folding up. Specifically, the backplate structure 1 is in an expanded flat state prior to folding up. In bending, first, the auxiliary shaft portion 33 bend with the connecting portion 32 as an axis in a direction toward the covering portion 31 of the bendable module 3. Due to both the auxiliary shaft portion 33 and the covering portion 31 are equipped with the first and second magnets 310 and 330, the auxiliary shaft portion 33 is magnetically attached to the covering portion 31 of the bending module 3 and the display panel 4 by magnetic attraction (as shown in FIGS. 5 and 6). Then, apply a force on opposite sides of the supporting plate 2 to force the supporting plate 2, the casing 5, and the display panel 4 to fold up. The adhesive element 34 between the covering portion 31 and the shaft channel 21, and the leather material having certain ductility further facilitate bending of the backplate structure 1. Furthermore, the auxiliary shaft portion 33 has a diameter smaller than a width of the covering portion 31 of the bendable module 3 (as shown in FIG. 7) so that the bendable module 3 can be smoothly bent, thereby to allow the display panel 4 to fold up completely reaching 180 degrees in half (as shown in FIG. 6). In this manner, the backplate structure 1 and the display panel 4 of the present invention are significantly reduced in size after being folded up, such that they are substantially shaped as a notebook and therefore easy to carry.

Accordingly, the backplate structure 1 of the present invention utilizes the configuration of the flexible leather material in combination with the magnets, and the magnetic attraction of the second magnet 330 of the auxiliary shaft portion 33 and the first magnet 310 of the covering portion 31 to apply a force on the flexible display panel 4, so that the backplate 1 is easy to be bent over where the first and second magnet 310 and 330 are magnetically attracted, thereby to effectively overcome drawbacks of traditional display devices that are not provided with bendable structure, incapable of bending, and inconvenient to carry.

The present invention further provides a display device, an organic light emitting diode (OLED) display panel, and a backplate structure 1, as shown in FIG. 1. The backplate structure 1 includes a supporting plate 2 including at least a shaft channel 21 extending to opposite sides of the supporting plate 2, wherein a surface of the supporting plate 2 is attached with the OLED display panel. A bendable module 3 is disposed in the shaft channel 21 and includes a flexible covering portion 31 and at least a magnet 310 accommodated in and along the covering portion 31. A flexible casing 5 covers a surface of the supporting plate 2 opposite to the OLED display panel. The backplate structure 1 and the OLED display panel are foldable through the bendable module 3 in a direction toward the OLED display panel.

The covering portion 31 of the bendable module 3 integrally extends to form a connecting portion 32 and an auxiliary shaft portion 33. One end of the connecting portion 32 is connected with the covering portion 31, and the other end of the connecting portion 32 is connected with the auxiliary shaft portion 33. A second magnet 330 is accommodated in the auxiliary shaft portion 33. The second magnet 330 in the auxiliary shaft portion 33 is movable to the bendable module 3 by bending the connecting portion 32 and is magnetically attached onto the at least a first magnet 310 in the bendable module 2 and the display panel.

It is understood that the invention may be embodied in other forms within the scope of the claims. Thus the present examples and embodiments are to be considered in all respects as illustrative, and not restrictive, of the invention defined by the claims.

What is claimed is:

1. A bendable backplate structure, configured to support a display panel, the backplate structure comprising:
    a supporting plate comprising at least a shaft channel extending to opposite sides of the supporting plate, wherein a surface of the supporting plate is attached with the display panel; and
    a bendable module disposed in the shaft channel and comprising a flexible covering portion and at least a first magnet accommodated in and along the covering portion, wherein the covering portion integrally extends to form a connecting portion and an auxiliary shaft portion, one end of the connecting portion is connected with the covering portion, the other end of the connecting portion is connected with the auxiliary shaft portion, and a second magnet is accommodated in the auxiliary shaft portion, wherein the second magnet is movable to the bendable module by bending the connecting portion and is magnetically attached to both the first magnet and the display panel;
    wherein the backplate structure and the display panel are foldable through the bendable module in a direction toward the display panel.

2. The backplate structure of claim 1, wherein the auxiliary shaft portion comprises an accommodation portion for accommodating a stylus pen.

3. The backplate structure of claim 1, wherein the auxiliary shaft portion has a diameter smaller than a width of the covering portion of the bendable module.

4. The backplate structure of claim 1, wherein the second magnet in the auxiliary shaft portion is cylindrical in shape, and one end of the auxiliary shaft portion far away from the connecting portion extends to one end of the bendable module far away from the connecting portion.

5. The backplate structure of claim 1, wherein the backplate structure further comprises a flexible casing covering a surface of the supporting plate opposite to the display panel.

6. The backplate structure of claim 1, wherein the supporting plate further comprises an opening portion located corresponding to components of the display panel and configured for accommodating the components.

7. The backplate structure of claim 1, wherein a flexible, adhesive element is provided between the covering portion of the bendable module and the shaft channel for bonding the bendable module and the shaft channel together.

8. A display device, comprising:
    an organic light emitting diode (OLED) display panel; and
    a backplate structure, comprising:
    a supporting plate comprising at least a shaft channel extending to opposite sides of the supporting plate, wherein a surface of the supporting plate is attached with the OLED display panel;
    a bendable module disposed in the shaft channel and comprising a flexible covering portion and at least a first magnet accommodated in and along the covering portion, wherein the covering portion integrally extends to form a connecting portion and an auxiliary shaft portion, one end of the connecting portion is connected with the covering portion, the other end of the connecting portion is connected with the auxiliary shaft portion, and a second magnet is accommodated in the auxiliary shaft portion, wherein the second magnet is movable to the bendable module by bending the connecting portion and is magnetically attached to both the first magnet and the display panel; and
    a flexible casing covering a surface of the supporting plate opposite to the OLED display panel;
    wherein the backplate structure and the OLED display panel are foldable through the bendable module in a direction toward the OLED display panel.

9. The display device of claim 8, wherein the backplate structure further comprises a flexible casing covering a surface of the supporting plate opposite to the display panel.

10. The display device of claim 8, wherein the supporting plate further comprises an opening portion located corresponding to components of the display panel and configured for accommodating the components.

11. A bendable backplate structure, configured to support a display panel, the backplate structure comprising:
- a supporting plate comprising at least a shaft channel extending to opposite sides of the supporting plate and disposed on a middle of the supporting plate, wherein a surface of the supporting plate is attached with the display panel; and
- a bendable module disposed in the shaft channel and comprising a flexible covering portion and at least a first magnet accommodated in and straightly along the covering portion, and the backplate structure and the display panel being foldable through the bendable module in a direction toward the display panel;

wherein the covering portion of the bendable module integrally extends to form a connecting portion and an auxiliary shaft portion, one end of the connecting portion is connected with the covering portion, and the other end of the connecting portion is connected with the auxiliary shaft portion, and the auxiliary shaft portion is accommodated with a second magnet, wherein the second magnet in the auxiliary shaft portion is movable to the bendable module by bending the connecting portion and is magnetically attached to both the first magnet in the bendable module and the display panel.

12. The backplate structure of claim 11, wherein the auxiliary shaft portion has a diameter smaller than a diameter of the covering portion of the bendable module.

13. The backplate structure of claim 11, wherein the backplate structure further comprises a flexible casing covering a surface of the supporting plate opposite to the display panel.

14. The backplate structure of claim 11, wherein the supporting plate further comprises an opening portion located corresponding to components of the display panel and configured for accommodating the components.

\* \* \* \* \*